(12) United States Patent
Shieh et al.

(10) Patent No.: US 8,273,600 B2
(45) Date of Patent: Sep. 25, 2012

(54) SELF-ALIGNED METAL OXIDE TFT WITH REDUCED NUMBER OF MASKS

(76) Inventors: Chan-Long Shieh, Paradise Valley, AZ (US); Gang Yu, Santa Barbara, CA (US); Fatt Foong, Goleta, CA (US)

( * ) Notice: Subject to any disclaimer, the term of this patent is extended or adjusted under 35 U.S.C. 154(b) by 0 days.

(21) Appl. No.: 13/195,882

(22) Filed: Aug. 2, 2011

(65) Prior Publication Data

US 2012/0168744 A1    Jul. 5, 2012

Related U.S. Application Data

(63) Continuation-in-part of application No. 13/116,292, filed on May 26, 2011, now Pat. No. 8,129,720.

(51) Int. Cl.
*H01L 21/00* (2006.01)
(52) U.S. Cl. ............... 438/104; 438/160; 257/E21.461
(58) Field of Classification Search .............. 438/159, 438/160; 257/E21.461
See application file for complete search history.

(56) References Cited

U.S. PATENT DOCUMENTS

| | | | |
|---|---|---|---|
| 6,403,408 B1 * | 6/2002 | Green et al. | 438/161 |
| 7,605,026 B1 * | 10/2009 | Shieh et al. | 438/151 |
| 7,872,263 B2 * | 1/2011 | Huang et al. | 438/160 |

* cited by examiner

*Primary Examiner* — Chandra Chaudhari
(74) *Attorney, Agent, or Firm* — Parsons & Goltry; Robert A. Parsons; Michael W. Goltry

(57) ABSTRACT

A method of fabricating MOTFTs on transparent substrates by positioning opaque gate metal on the substrate front surface and depositing gate dielectric material overlying the gate metal and a surrounding area and metal oxide semiconductor material on the dielectric material. Depositing selectively removable etch stop material on the semiconductor material and photoresist on the etch stop material to define an isolation area in the semiconductor material. Removing uncovered portions of the etch stop. Exposing the photoresist from the substrate rear surface using the gate metal as a mask and removing exposed portions leaving the etch stop material overlying the gate metal covered. Etching the semiconductor material to isolate the TFT. Selectively etching the etch stop layer to leave a portion overlying the gate metal defining a channel area. Depositing and patterning conductive material to form source and drain areas on opposed sides of the channel area.

20 Claims, 4 Drawing Sheets

SELF-ALIGNED METAL OXIDE TFT WITH REDUCED NUMBER OF MASKS

FIELD OF THE INVENTION

This invention generally relates to a self-alignment fabrication of metal oxide TFTs to remove critical alignment tools and a reduction in masks during manufacturing.

BACKGROUND OF THE INVENTION

Metal oxide thin film transistors (MOTFT) are gaining interest as high performance TFT backplanes for large area applications such as active matrix organic light emitting diodes (AMOLED). MOTFTs have gained popularity because of their high mobility in amorphous states and low fabrication temperature. The high mobility enables applications that require high performance such as integrated drivers, driving OLED displays. See for example the copending U.S. patent application entitled "Active Matrix Light Emitting Display" bearing Ser. No. 12/178,209, filed on 23 Jul. 2008, and incorporated herein by reference. The amorphous nature enables short range uniformity which plagues poly-Si TFTs. The low fabrication temperature makes the MOTFTs attractive for large area flat panel displays (FPD) because they can be fabricated on low cost substrates and even achieve flexible FPDs.

Some remaining challenges are to reduce the parasitic gate-to-source and gate-to-drain capacitances. These capacitances become important with display frame rate, when the number of pixels in a row increase along with information content. Overlap between the gate and the source/drain regions leads to the parasitic gate-to-source and gate-to-drain capacitances. The overlap is necessary to insure that the channel is fully controlled by the gate. But an excessive overlap leads to the large parasitic capacitances. The degree of overlapping is determined by the alignment capability between the patterning of the gate layer, the channel layer, and the source/drain metal layer. There will be some degree of misalignment due to tool capability, which can also be eliminated by the present method. The other major misalignment, and that which is also addressed here, is due to substrate deformation (i.e. deformation of substrates in processing such as in glass substrates due to high temperature treatment or in plastic substrates due to an increase in moisture, chemical and heat treatment). Basically, the overlap is designed so that under the worst circumstance there will be overlap between the gate and the source/drain metal. For low cost FPDs the area of the substrates is large and the size of exposure field is also large. The misalignment is going to be relatively large over large substrates and thus large exposure fields. Large overlap designs are needed to compensate for all potential misalignments, thereby leading to large parasitic overlap capacitances.

Typically, misalignment due to deformation increases with the size of the exposure field. One way to compensate for the deformation is to reduce the exposure field by performing multiple exposures on the substrate and then stitching the multiple patterns together. However, this approach substantially increases the manufacturing cost due to lower through put and the high cost of stitching. Many of the large area applications use either glass or plastic substrates. To produce TFTs on large areas at low cost, it is advantageous to use low cost lithographic tools such as proximity/projection aligners rather than the more expensive stepper tools.

The large parasitic capacitances lead to slower waveforms and more power consumption. It is important therefore to reduce the parasitic capacitances while maintaining the minimum overlap between the gate and the source/drain to ensure that the channel is fully controlled by the gate. Also, these conditions have to be met over the large substrate areas regardless of substrate deformations and tool alignment capabilities.

Another item to be addressed herein is the cost of manufacturing the TFTs. Primarily, the cost of manufacturing TFTs depends on the number of masks used during the manufacturing process. Lithography is a big part of the fabrication cost. Therefore, a reduction in the number of masks (e.g. from four masks to three masks), while still achieving the self-alignment between the gate and the source/drain, can result in a major reduction in the overall cost.

It would be highly advantageous to have a self-aligned process in which there are no or fewer critical alignment steps.

Accordingly, it is an object of the present invention to provide new and improved methods of fabricating self-aligned metal oxide TFTs.

It is another object of the present invention to provide new and improved methods of fabricating metal oxide TFTs including no critical alignment tools or steps and using a minimum of process steps.

It is another object of the present invention to provide new and improved methods of fabricating self-aligned metal oxide TFTs using a reduced number of masks.

It is another object of the present invention to provide new and improved methods of fabricating self-aligned metal oxide TFTs with reduced inter-electrode capacitance.

It is another object of the present invention to provide a new and improved amorphous metal oxide TFT with reduced inter-electrode capacitance.

SUMMARY OF THE INVENTION

Briefly, to achieve the desired objects of the instant invention in accordance with a preferred embodiment thereof, provided is a method of fabricating metal oxide TFTs on transparent substrates including the steps of providing a transparent substrate having a front surface and a rear surface, positioning opaque gate metal on the front surface of the substrate defining a gate area for a TFT, depositing a layer of transparent gate dielectric material on the front surface of the substrate overlying the gate metal and a surrounding area and a layer of transparent metal oxide semiconductor material on the surface of the layer of transparent gate dielectric.

The method further includes depositing a layer of etch stop material on the layer of metal oxide semiconductor material and positioning photoresist material on the layer of etch stop material. The etch stop material and the photoresist material are selectively removable and the photoresist material is one of patterned and selectively removed to define an isolation area in the layer of transparent metal oxide semiconductor material.

The method then includes removing uncovered portions of the layer of etch stop material, remaining portions of the layer of etch stop material forming a metal oxide semiconductor material etch mask and a step of exposing the photoresist material from the rear surface of the substrate using the opaque gate metal on the front surface of the substrate as a mask and removing exposed portions of the photoresist material so as to leave the layer of etch stop material uncovered except for a portion overlying and aligned with the gate metal.

Using the metal oxide semiconductor material etch mask, etching uncovered portions of the metal oxide semiconductor material so as to isolate the TFT and using the portion of the photoresist material directly overlying and aligned with the gate metal, selectively etching uncovered portions of the etch stop layer leaving a portion of the etch stop layer overlying and aligned with the gate metal. The portion of the etch stop layer defines a channel area in the layer of metal oxide semiconductor material and serves as a passivation layer for the metal oxide. The final step of the method is depositing and patterning conductive material on the portion of the etch stop layer overlying and aligned with the gate metal and on the layer of metal oxide semiconductor material to form source and drain areas on opposed sides of the channel area.

The amorphous metal oxide TFT has reduced inter-electrode capacitance generally because of the alignment of the etch stop layer with the gate metal substantially without regard to deformation of the substrate. Further, the amorphous metal oxide TFT has reduced inter-electrode capacitance generally because the etch stop layer is substantially thicker than the gate dielectric layer and the dielectric constant is substantially lower.

The desired objects of the instant invention are further realized in accordance with a preferred embodiment thereof, which provides a metal oxide TFT with reduced interelectrode capacitance. The TFT includes a transparent substrate having a front surface and a rear surface, an opaque gate metal positioned on the front surface of the substrate and defining a gate area for a TFT, a layer of transparent gate dielectric material positioned on the front surface of the substrate overlying the gate metal and a surrounding area, and a layer of transparent metal oxide semiconductor material positioned on the surface of the layer of transparent gate dielectric. A layer of etch stop material is positioned on the layer of metal oxide semiconductor material overlying and aligned with the gate metal. The layer of the etch stop material defines a channel area in the layer of metal oxide semiconductor material. Conductive material is patterned on the portion of the etch stop layer overlying and aligned with the gate metal and on the layer of metal oxide semiconductor material to form source and drain areas on opposed sides of the channel area.

In a preferred embodiment the layer of etch stop material has a thickness greater than the thickness of the layer of transparent gate dielectric material and a lower dielectric constant than a dielectric constant of the transparent gate dielectric material to substantially reduce interelectrode capacitance.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 2:
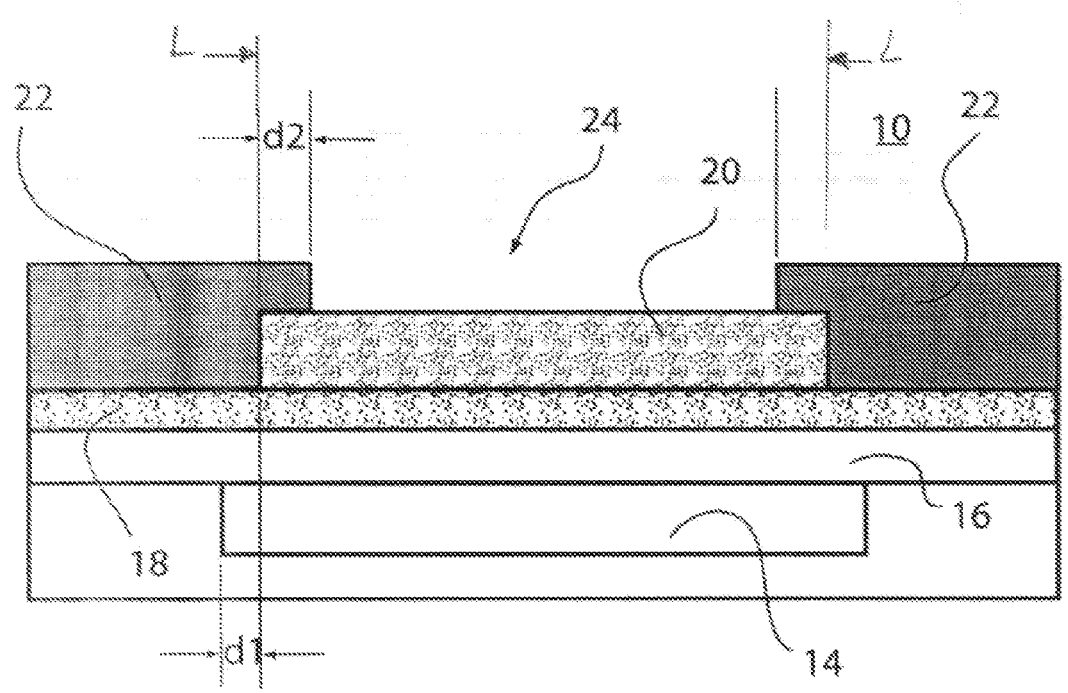
FIG. 2 illustrates an enlarged final stage or phase in the fabrication of TFTs in accordance with the present invention.

Turning now to the drawings, attention is first directed to FIG. 2, for the purpose of briefly explaining prior art problems. The device illustrated in FIG. 2 is a bottom gate and top source/drain metal oxide TFT, designated 10. TFT 10 includes a substrate 12 with gate metal 14 patterned thereon. A gate dielectric layer 16 is deposited over gate metal 14 and a semiconductor active layer 18 is deposited over dielectric layer 16 so as to insulate active layer 18 from gate metal 14. An etch stop/passivation area 20 is patterned on active layer 18 and source/drain areas 22 are formed on opposite sides of etch stop/passivation area 20 on the upper surface of active layer 18. The space between the source and drain, i.e. etch stop/passivation area 20, defines the conduction channel, designated 24, for TFT 10. It will be understood by the artisan that the terms "etch stop" and "passivation" are used throughout this disclosure to describe the primary purpose of specific layers but that they are generally interchangeable and the title provide is not intended to limit the purpose or use of the layer. For example, area 20 has the dual function of an etch stop layer and a passivation layer.

In the prior art process of fabricating TFT 10, two critical alignment steps are prevalent. The first critical alignment step is between passivation area 20 (channel protection layer) and gate metal 14. Gate metal 14 should be slightly larger than passivation area 20, indicated as overlap area d1 where d1>0. The second critical alignment is between the pattern for source/drain 22 and passivation area 20. There should be a slight overlap between source/drain areas 22 and passivation area 20, indicated as overlap area d2 where d2>0, so that the etching of the source/drain conductor in the formation of source/drain areas 22 (i.e. the channel space between source/drain 22) will not affect active layer 18. That is the possibility that an etchant can pass around the edges of passivation area 20 and reach active layer 18 is prevented by overlap d2. It will be understood that any alignment patterning includes some tolerance and that the fabrication process includes some deformation tolerance.

Therefore to make a channel length of L (generally the horizontal width of passivation area 20), the distance between the source and drain should be smaller than (L−2×d2). In this relationship or description of L, d2 includes any alignment and deformation tolerance. Further, horizontal width of gate metal 14 should be larger than (L+2×d1). In this relationship or description of L, d1 includes any alignment and deformation tolerance. Thus, the value of overlaps d1 and d2 depends on the alignment tool (i.e. the alignment tolerance) and the amount of substrate deformation during the fabrication process. For low cost tools, overlaps d1 and d2 are relative large, around 5 microns without the added contribution from substrate deformation. For 10 ppm substrate deformation, a field size of 50 cm can contribute another 5 microns to the tolerance. It is desirable at present to fabricate TFTs with channel lengths as small, or smaller, than 10 microns. However, using the prior art fabrication methods described above with low cost tools and large field sizes, forming a channel length of 10 microns is not possible, or alternatively a source/drain spacing of 10 microns, will result in L equaling 30 microns because of the alignment/deformation tolerances included in overlaps d1 and d2.

Figure 1:
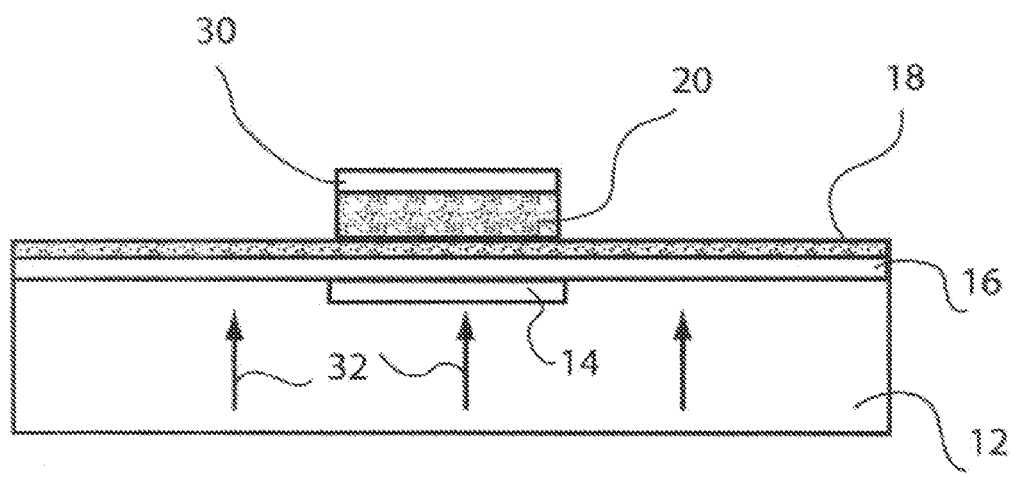
FIG. 1 illustrates a first stage or phase in the fabrication of TFTs in accordance with the present invention.

To understand the self-alignment procedure of the present invention, FIGS. 1 and 2 illustrate sequential steps in an embodiment fabricated in accordance with the present invention. Turning specifically to FIG. 1, a transparent substrate 12 is illustrated, which may be any convenient material transparent to radiation (i.e. self-alignment exposure) wavelength used in the self-alignment procedure, such as glass, plastic, etc. Throughout this disclosure the terms "transparent" and "opaque" mean that the material being discussed or described is transparent or opaque to radiation (i.e. exposure) wavelengths used in the self-alignment procedure. Gate metal layer 14 is patterned on the upper surface of substrate 12 by any convenient means. Since the position of gate metal layer 14 is not critical virtually any non-critical patterning technique can be used.

It will be understood by those of skill in the art that in addition to or instead of forming gate metal layer 14 with a proximity or a projection tool, the gate layer can be formed with any of the various printing processes known to experts in the field, including ink jetting, imprinting or off-set printing methods, layer 14 can also be patterned with laser writing lithography. Also, gate metal 14 is an opaque conductive metal that will not transmit the radiation wavelengths used in the self-alignment procedure. While a single gate metal 14 is illustrated for convenience in understanding, it will be understood that this might represent one or more (even all) of the TFTs used in a backplane or other large area applications.

A thin layer 16 of gate dielectric material is formed over gate metal 14 and the surrounding area. For purposes of this disclosure the term "surrounding area" includes at least the area illustrated in the figures (i.e. the gate and channel areas and the source/drain areas). Again, layer 16 may be a blanket layer covering the entire large area application and no alignment is required. The gate dielectric material may be any convenient material that provides the desired dielectric constant for TFT operation and is transparent to the radiation wavelengths used in the self-alignment procedure. A layer 18 of semiconductor metal oxide is deposited over the upper surface of layer 16. Metal oxide layer 18 is transparent to the radiation wavelengths used in the self-alignment procedure. Some typical examples of transparent metal oxide semiconductor materials include ZnO, InO, AlSnO, ZnInO, InAlZnO, InGaSnO, InAlSnO, InGaZnO, ZnSnO, GaSnO, InGaCuO, InCuO, AlSnO, AlCuO, etc. As explained in the above described copending patent application, the metal oxide semiconductor may be amorphous or polycrystalline, however, amorphous or nano-crystalline is preferred. Layer 18 may be a blanket layer or it may optionally be patterned, depending primarily on the final product.

A passivation layer transparent to the radiation wavelengths used in the self-alignment procedure is then deposited over layer 18. Preferably, the constraint on the passivation layer is that the passivation layer should have very little chemical interaction with the underlying semiconductor metal oxide layer 18. For examples and explanations of this feature see the copending U.S. patent application entitled "Metal Oxide TFT with Improved Carrier Mobility", bearing Ser. No. 12/173,995, filed on 16 Jul. 2008, and incorporated herein by reference. Examples of passivation material that can be processed by a coating process (such as spin coating, slot coating, spray coating, etc.) include polymer PMGI, polystyrene, PMMA, Polyethylene, and spin on glass. Examples of passivation material that can be processed by vacuum deposition (such as thermal evaporation or sputter) include $MgF_2$, TaO, $SiO_2$, $Al_2O_3$, AlN, etc.

Once the passivation layer is deposited, a positive working photoresist layer 30 is positioned thereon, for example by spin coating, slot coating, spray coating, or the like. Photoresist layer 30 is then exposed from the back (rear surface, below substrate 12 in FIG. 1, represented by arrows 32). Since all of the materials except the gate metal are transparent to the exposing light, gate metal 14 will act as a mask for the alignment of the passivation area 20. Thus, photoresist layer 30 is exposed and developed to form a mask for the etching of the passivation layer into passivation area 20 overlying gate metal 14. As illustrated in FIG. 1, all exposed portions of photoresist layer 30 are removed because the exposed portions of the positive photoresist decompose or disassociate (change relative to the unexposed portion) to allow the exposed areas to be relatively easily removed in the developing stage. The passivation material over the exposed areas can be etched away using the first photoresist as a mask, generally with a light etchant or other dissolving material, with no effect on the lower surface.

Regardless which method or process for patterning passivation area 20 is used, the method should not destroy or adversely affect semiconductor active layer 18. Some extra mask pattern may be needed or used to pattern other parts of the product outside of TFT 10 and the critical gate area. A description of such parts of the product outside of TFT 10 is provided in a copending U.S. patent application entitled "Self-Aligned Transparent Metal Oxide TFT on Flexible Substrate", bearing Ser. No. 11/949,477, filed on 3 Dec. 2007, and incorporated herein by reference. The pattern in such non-critical areas can also be formed by one of several printing methods (such as imprinting, inkjet printing, solution dispensing, laser printing, etc.) known to artisans in the printing field.

It will be understood that substantially complete control is possible for the size of overlap d1 during the masking and etching stages without requiring additional steps or materials. For example, referring to the first masking step illustrated in FIG. 1, by changing the exposure time or intensity (e.g. increasing or decreasing either one) the amount of remaining photoresist can be decreased or increased, thus altering the width of overlap d1. Also, the etch used in conjunction with either of the patterns in FIGS. 1 and 3 can be increased to increase overlap d1. These features and how to adjust them are well known in the self-alignment field and are included in the term 'self-align" or "self-alignment" when used to describe the process.

It can be seen that no critical masking step is performed in which expensive tools are required. Also, because of the substantially complete control of the overlap or critical areas, any overlap can be provided from substantially zero to any desired amount without the necessity of sacrificing small channel lengths. Further, no expensive masks or tools are required and larger areas can be exposed during the process so that expensive stepping and stitching or the like are not required.

Figure 3:
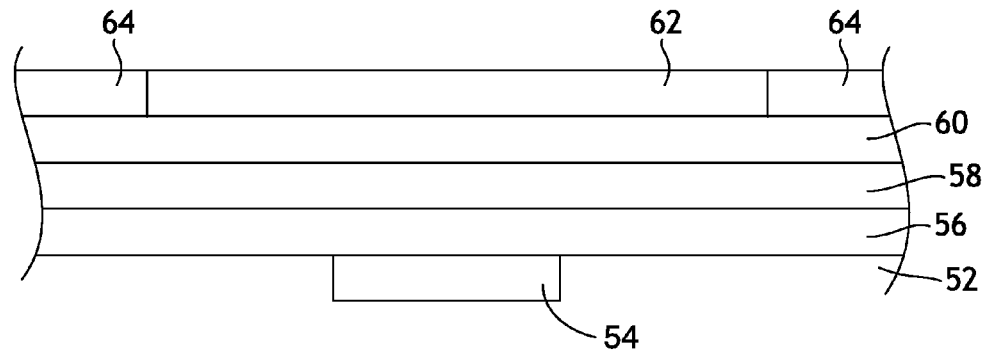
FIGS. 3 through 9 illustrate several stages or phases in another fabrication process of TFTs in accordance with the present invention.

Several stages or phases in another fabrication process of TFTs is illustrated in FIGS. 3 through 9 in accordance with the present invention. Turning specifically to FIG. 3, a transparent substrate 52 is illustrated, which may be any convenient material transparent to radiation (i.e. self-alignment exposure) wavelength used in the self-alignment procedure, such as glass, plastic, etc. Gate metal layer 54 is patterned on/in the upper surface of substrate 52 by any convenient means. Since the position of gate metal layer 54 is not critical virtually any non-critical patterning technique can be used. It will be understood by those of skill in the art that in addition to or instead of forming gate metal layer 54 with a proximity or a projection tool, the gate layer can be formed with any of the various printing processes mentioned above, including imprinting or off-set printing methods. Also, gate metal 54 is an opaque conductive metal that will not transmit the radiation wavelengths used in the self-alignment procedure. While a single gate metal 54 is illustrated for convenience in understanding, it will be understood that this might represent one or more (even all) of the TFTs used in a backplane or other large area applications. The patterning of gate metal 54 is considered in this procedure as the first of three masking or alignment steps.

A thin layer 56 of gate dielectric material is formed over gate metal 54 and the surrounding area. For purposes of this disclosure the term "surrounding area" includes at least the area illustrated in the figures (i.e. the gate and channel areas and the source/drain areas). Again, layer 56 may be a blanket layer covering the entire large area application and no alignment is required. The gate dielectric material may be any convenient material that provides the desired dielectric constant for TFT operation and is transparent to the radiation wavelengths used in the self-alignment procedure. A layer 58 of semiconductor amorphous metal oxide is deposited over the upper surface of layer 56. Metal oxide layer 58 is transparent to the radiation wavelengths used in the self-alignment procedure. Some typical examples of transparent metal oxides include ZnO, InO, AlZnO, ZnInO, InAlZnO, InGaZnO, ZnSnO, GaSnO, InGaCuO, InCuO, AlCuO, etc. As explained in the above described copending patent application, the metal oxide semiconductor may be amorphous or polycrystalline, however, amorphous is preferred. Layer 58 may be a blanket layer or it may optionally be patterned, depending primarily on the final product. However, since the patterning would be, at the most very large, and since it is optional this is not considered a masking step of the present process.

A layer 60 of etch stop material is deposited in a blanket layer over metal oxide semiconductor layer 58. It will be understood from the following description that layer 60, while referred to as an "etch stop material", actually has the dual function of an etch stop material and a passivation material and the title is not intended to in any way limit the scope of the invention. Generally, etch stop layer 60 is selected to be etchable by a process that does not use or generate UV light, such as a standard wet etch process. Also, etch stop layer 60 is much thicker than gate dielectric layer 56 and the dielectric constant is much lower than the dielectric constant of the gate dielectric. As an example, etch stop layer 60 is generally greater than twice as thick as gate dielectric layer 56 or at least 500 nm thick while dielectric layer 56 is generally in a range of 100 nm to 200 nm thick. It will be understood that the etch stop material can be any material that fulfills these requirements. A layer 62 of photo patternable material, preferably a positive photoresist material, is coated or deposited in a blanket layer over etch stop layer 60. Photo resist layer 62 can be deposited, for example by spin coating, slot coating, spray coating, or the like. Generally, photoresist layer 62 is a standard material that is exposed by typical UV sources in a normal lithographic process and is not affected by the wet etch process used to remove portions of etch stop layer 60. In a second masking step, outer portions 64 of layer 62 are exposed and developed (removed) using a typical UV source (>350 nm) in conjunction with an isolation mask (not shown). It will be understood that layers 60 and 62 are specifically selected to be individually or selectively removable. For a better understanding in this process the term "non-UV etch" is any etch process that does not have or include any UV generation source.

Figure 4:
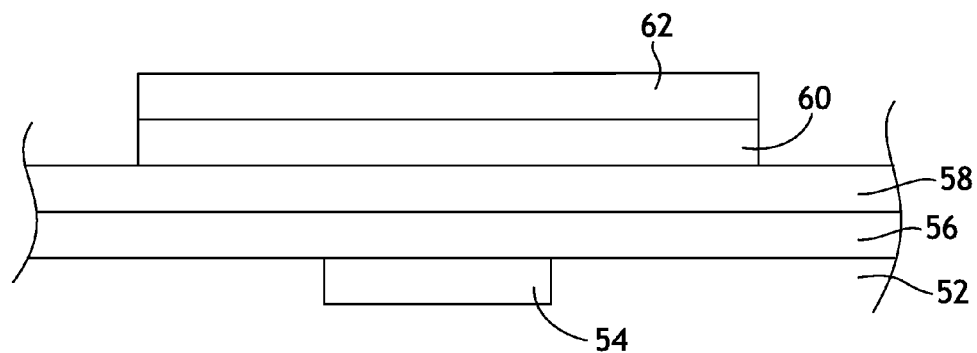
Figure 5B:
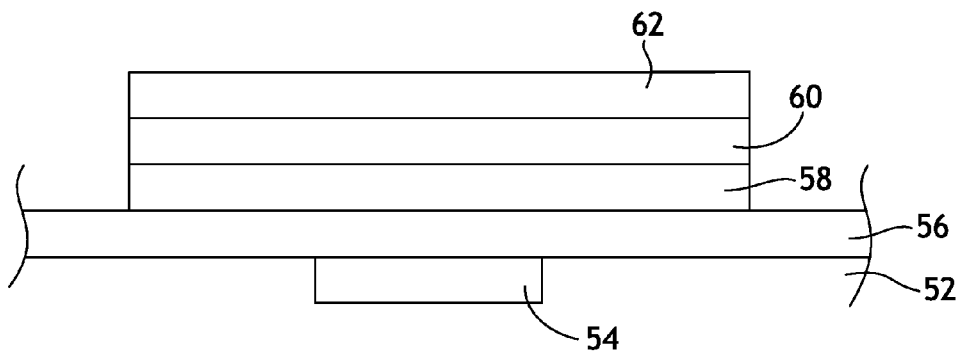
Figure 5A:
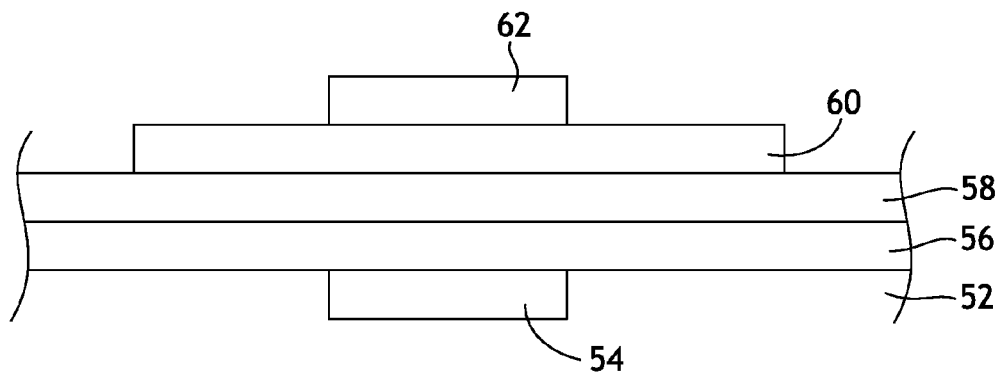
Figure 6:
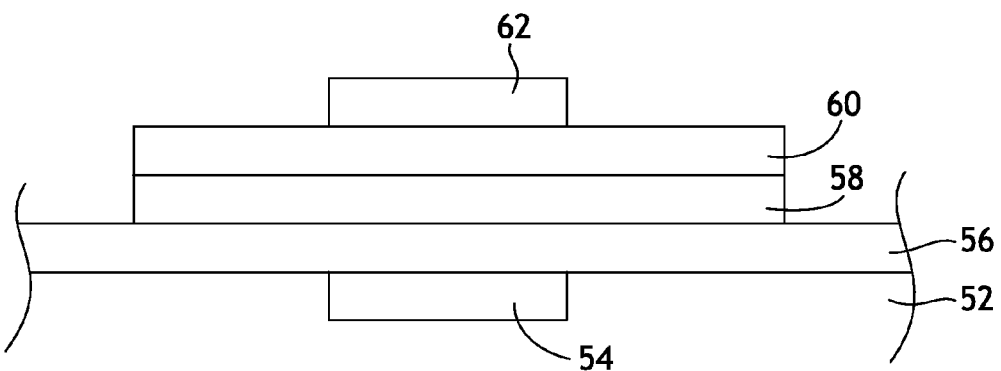

Turning specifically to FIG. 4, with portions 64 of layer 62 removed, outer uncovered portions of etch stop layer 60 can be removed using a non-UV etch, generally a wet etch. Referring additionally to FIG. 5A, in the preferred process photoresist layer 62 is then exposed from the back (rear surface, below substrate 52 in FIG. 5A). Since all of the materials except gate metal 54 are transparent to the exposing light, gate metal 54 will act as a mask for the ultimate alignment of etch stop layer 60. Thus, photoresist layer 62 is exposed and developed to form a mask for the subsequent etching of etch stop layer 60. Referring additionally to FIG. 6, etch stop layer 60 is used as a mask to etch metal oxide semiconductor layer 58 to isolate or define the limits of the TFT active layer. Because photoresist layer 62 has already been exposed and developed, it is not necessary to limit the etch process used for etching semiconductor layer 58 to a non-UV etch at this point and a simple dry etch or any other convenient etch can be used.

It will be understood that the step of exposing photoresist layer 62 from the rear surface and developing or removing the material and the step of etching metal oxide semiconductor layer 58 can be performed in any convenient order and neither of the steps is considered a masking step of the present process. For example and referring to FIG. 5B, it can be seen that metal oxide semiconductor layer 58 can be etched prior to exposing and developing photoresist layer 62. However, when using these process steps a non-UV etch process must be used in etching metal oxide semiconductor layer 58 so as not to affect photoresist layer 62. Photoresist layer 62 is then exposed from the back (rear surface, below substrate 52 in FIG. 5B) to arrive at the structure illustrated in FIG. 6.

Figure 7:
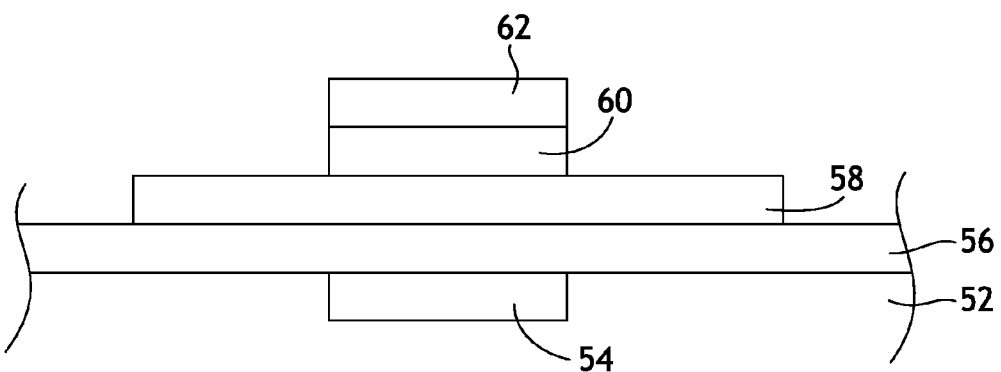

Referring specifically to FIG. 7, etch stop layer 60 is etched using some convenient etch and using the remaining portion of photoresist layer 62 as a mask. Since the remaining portion of photoresist layer 62 is accurately aligned with gate metal 54 by the rear exposure process and is not affected by substrate deformation, the remaining portion of etch stop layer 60 will be accurately aligned with gate metal 54.

Figure 8:
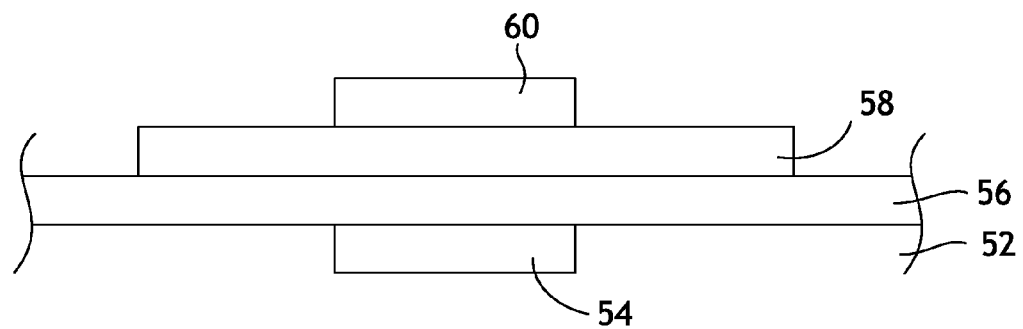
Figure 9:
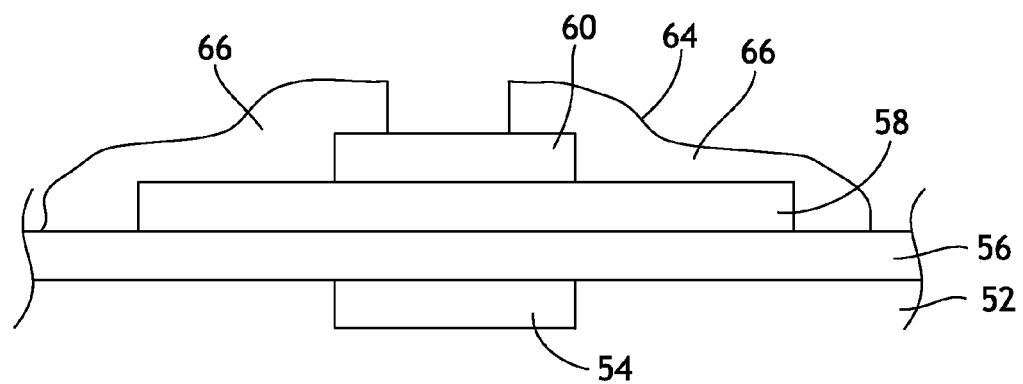

Referring additionally to FIG. 8, the remaining portion of photoresist layer 62 is simply and easily stripped to leave the portion of etch stop layer 60 overlying the active layer 58 of metal oxide semiconductor material. As illustrated in FIG. 9, a layer 64 of source/drain metal is deposited and patterned using the remaining portion of etch stop layer 60 to define a channel in layer 58 of metal oxide semiconductor material. The patterning of metal layer 64 into spaced apart source and drain contacts 66 is the third and final masking step of the present process.

In a preferred embodiment, source/drain metal layer 60 consists of two layers. A top layer can be any metal that can provide good conductivity, such as A1, and can be selectively etched over a bottom layer. The bottom layer is a metal that can be patterned without etching the metal oxide of layer 58, such as Mo, Ti, Ta, etc. or a metal alloy including any such metal. In the preferred process the top layer is etched first and the chemistry is changed to etch the bottom layer. Source/drain metal 66 is defined in the traditional way by allowing a large overlap with gate 54 but the overlap capacitance is greatly reduced by the thickness and low dielectric constant of etch stop layer 60.

In a variation of the above described three-mask process, etch stop layer 60 can be printed with an isolation mask pattern (much larger than the etch stop pattern and therefore feasible). The result is basically the etch stop formation illustrated in FIG. 5A, without the overlying layer 62 of photoresist. The printed etch stop layer 60 is used as a mask to etch metal oxide layer 58 for isolation. After metal oxide layer 58 is etched, a layer of regular positive photoresist is blanket coated and exposed from the backside of substrate 52 without masking. The coating can be accomplished using any one of a variety of methods including for example by spin coating, dip coating, inkjet printing, screen printing, Gravure printing, and the like. The developed photoresist (generally as illustrated in FIGS. 6 and 7) is used as a mask to pattern etch stop layer 60. The photoresist is removed and source/drain metal deposited and patterned as described above.

In either case it should be specifically noted that other components in a flat panel circuit can also be made concurrently during the TFT process, including capacitors and contact pads for connecting wafer based drivers in peripheral areas surrounding the display area. The other components are easily included in the process with no need for additional masks or other steps. Thus, the process disclosed in this invention can be conveniently used to make entire backpanels for displays or other applications with a substantial reduction in process steps and labor.

Thus, another process is described for fabricating MOT-FTs with substantially reduced overlap and requiring three masking steps rather than the four masking steps as in the prior art. Also, the etch stop layer is formed much thicker than the gate dielectric layer and with a much lower dielectric constant. Thus, in addition to the substantially reduced overlap the dielectric in the overlap has a substantially increased thickness and lower dielectric constant so that the capacitance is substantially reduced. Therefore, a reduction in the number of masks (i.e. from four masks to three masks), while still achieving the self-alignment between the gate and the source/drain, results in a major reduction in the overall cost. It should further be noted that other components in a flat panel circuit can also be made concurrently during the TFT process, including capacitors and contact pads for connecting wafer based drivers in peripheral areas surrounding the display area. The process disclosed in this invention can thus be used to make entire backpanels for displays or other applications.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating metal oxide TFTs on transparent substrates comprising the steps of:
    providing a transparent substrate having a front surface and a rear surface;
    positioning opaque gate metal on the front surface of the substrate defining a gate area for a TFT;
    depositing a layer of transparent gate dielectric material on the front surface of the substrate overlying the gate metal and a surrounding area and a layer of transparent metal oxide semiconductor material on the surface of the layer of transparent gate dielectric;
    depositing a layer of etch stop material on the layer of metal oxide semiconductor material;
    positioning photoresist material on the layer of etch stop material, the etch stop material and the photoresist material being selectively removable, the photoresist material being one of patterned and selectively removed to define an isolation area in the layer of transparent metal oxide semiconductor material;
    removing uncovered portions of the layer of etch stop material, remaining portions of the layer of etch stop material forming a metal oxide semiconductor material etch mask;
    exposing the photoresist material from the rear surface of the substrate using the opaque gate metal on the front surface of the substrate as a mask and removing exposed portions of the photoresist material so as to leave the layer of etch stop material uncovered except for a portion overlying and aligned with the gate metal;
    using the metal oxide semiconductor material etch mask, etching uncovered portions of the metal oxide semiconductor material so as to isolate the TFT;
    using the portion of the photoresist material directly overlying and aligned with the gate metal, selectively etching uncovered portions of the etch stop layer leaving a portion of the etch stop layer overlying and aligned with the gate metal, the portion of the etch stop layer defining a channel area in the layer of metal oxide semiconductor material; and
    depositing and patterning conductive material on the portion of the etch stop layer overlying and aligned with the gate metal and on the layer of metal oxide semiconductor material to form source and drain areas on opposed sides of the channel area.

2. A method as claimed in claim 1 wherein the step of depositing a layer of etch stop material includes depositing a layer thicker than a thickness of the layer of transparent gate dielectric material.

3. A method as claimed in claim 2 wherein the step of depositing a layer of etch stop material thicker than the thickness of the layer of transparent gate dielectric material includes depositing a layer of etch stop material greater than twice as thick as the thickness of the gate dielectric material.

4. A method as claimed in claim 2 wherein the step of depositing a layer of etch stop material thicker than the thickness of the layer of transparent gate dielectric material includes depositing a layer of etch stop material with a thickness greater than 500 nm.

5. A method as claimed in claim 1 wherein the step of depositing a layer of etch stop material includes depositing a material with a lower dielectric constant than a dielectric constant of the transparent gate dielectric material.

6. A method as claimed in claim 1 wherein the step of positioning the photoresist material includes depositing a layer of positive photoresist material, using an isolation mask exposing portions of the layer of positive photoresist material, and removing exposed portions defining an isolation area.

7. A method as claimed in claim 1 wherein the step of positioning photoresist material includes forming a blanket layer of positive photo resist material and using the second mask exposing and removing portions of the blanket layer to define the isolation area in the layer of transparent metal oxide semiconductor material.

8. A method as claimed in claim 1 wherein the step of positioning the photoresist material includes patterning areas of photoresist material separated by isolation areas.

9. A method as claimed in claim 8 wherein the step of patterning areas includes using one of spin coating, dip coating, inkjet printing, screen printing, and Gravure printing to apply the photoresist material.

10. A method as claimed in claim 1 wherein the step of depositing a layer of etch stop material includes a material selected to be etchable by a standard wet etch process not including the use of UV.

11. A method as claimed in claim 1 wherein the step of depositing and patterning conductive material includes depositing a top layer and a bottom layer, the top layer includes metal that provides good conductivity and can be selectively etched over the bottom layer, the bottom layer includes metal that can be patterned without etching the underlying layer of metal oxide.

12. A method as claimed in claim 1 wherein the step of depositing the layer of transparent metal oxide semiconductor material includes depositing one of ZnO, InO, AlZnO, ZnInO, InAlZnO, InGaSnO, InAlSnO, InGaZnO, ZnSnO, GaSnO, InGaCuO, InCuO, AlSnO, and AlCuO.

13. A method of fabricating metal oxide TFTs on transparent substrates using three masks and comprising the steps of:
    providing a transparent substrate having a front surface and a rear surface;

patterning with a first mask opaque gate metal on the front surface of the substrate defining a gate area for a TFT;

depositing a layer of transparent gate dielectric material on the front surface of the substrate overlying the gate metal and a surrounding area and a layer of transparent metal oxide semiconductor material on the surface of the layer of transparent gate dielectric;

depositing a layer of etch stop material on the layer of metal oxide semiconductor material;

patterning with a second mask positive photoresist material on the layer of etch stop material to define an isolation area in the layer of transparent metal oxide semiconductor material, the etch stop material and the photoresist material being selectively removable;

removing uncovered portions of the layer of etch stop material, remaining portions of the layer of etch stop material forming a metal oxide semiconductor material etch mask;

exposing the photoresist material from the rear surface of the substrate using the opaque gate metal on the front surface of the substrate as a mask and removing exposed portions of the photoresist material so as to leave the layer of etch stop material uncovered except for a portion overlying and aligned with the gate metal;

using the metal oxide semiconductor material etch mask, etching uncovered portions of the metal oxide semiconductor material so as to isolate the TFT;

using the portion of the photoresist material directly overlying and aligned with the gate metal, selectively etching uncovered portions of the etch stop layer leaving a portion of the etch stop layer overlying and aligned with the gate metal, the portion of the etch stop layer defining a channel area in the layer of metal oxide semiconductor material; and depositing and patterning with a third mask conductive material on the portion of the etch stop layer overlying and aligned with the gate metal and on the layer of metal oxide semiconductor material to form source and drain areas on opposed sides of the channel area.

14. A method as claimed in claim 13 wherein the step of depositing a layer of etch stop material includes depositing a layer thicker than a thickness of the layer of transparent gate dielectric material.

15. A method as claimed in claim 14 wherein the step of depositing a layer of etch stop material thicker than the thickness of the layer of transparent gate dielectric material includes depositing a layer of etch stop material greater than twice as thick as the thickness of the gate dielectric material.

16. A method as claimed in claim 14 wherein the step of depositing a layer of etch stop material thicker than the thickness of the layer of transparent gate dielectric material includes depositing a layer of etch stop material with a thickness greater than 500 nm.

17. A method as claimed in claim 13 wherein the step of depositing a layer of etch stop material includes depositing a material with a lower dielectric constant than a dielectric constant of the transparent gate dielectric material.

18. A method as claimed in claim 13 wherein the step of depositing and patterning conductive material includes depositing a top layer and a bottom layer, the top layer includes metal that provides good conductivity and can be selectively etched over the bottom layer, the bottom layer includes metal that can be patterned without etching the underlying layer of metal oxide.

19. A method as claimed in claim 13 wherein the step of patterning with the second mask positive photoresist material includes forming a blanket layer of positive photo resist material and using the second mask exposing and removing portions of the blanket layer to define the isolation area in the layer of transparent metal oxide semiconductor material.

20. A method as claimed in claim 13 wherein the step of patterning with the second mask positive photoresist material includes using one of spin coating, dip coating, inkjet printing, screen printing, and Gravure printing to apply the photoresist material.

* * * * *